United States Patent
Kalweit et al.

(10) Patent No.: US 10,767,143 B2
(45) Date of Patent: Sep. 8, 2020

(54) PARTICLE REMOVAL FROM ELECTROCHROMIC FILMS USING NON-AQUEOUS FLUIDS

(71) Applicant: SAGE Electrochromics, Inc., Faribault, MN (US)

(72) Inventors: Harvey Kalweit, Burnsville, MN (US); Satya Ajjarapu, Apple Valley, MN (US); Jean-Christophe Giron, Edina, MN (US)

(73) Assignee: SAGE ELECTROCHROMICS, INC., Faribault, MN (US)

( * ) Notice: Subject to any disclaimer, the term of this patent is extended or adjusted under 35 U.S.C. 154(b) by 285 days.

(21) Appl. No.: 14/198,824

(22) Filed: Mar. 6, 2014

(65) Prior Publication Data

US 2015/0253642 A1    Sep. 10, 2015

(51) Int. Cl.
| | | |
|---|---|---|
| *C11D 11/00* | (2006.01) | |
| *H01L 51/00* | (2006.01) | |
| *G02F 1/15* | (2019.01) | |

(52) U.S. Cl.
CPC ...... *C11D 11/0047* (2013.01); *C11D 11/0035* (2013.01); *G02F 1/15* (2013.01); *H01L 51/0021* (2013.01); *H01L 51/0096* (2013.01); *Y02E 10/549* (2013.01)

(58) Field of Classification Search
None
See application file for complete search history.

(56) References Cited

U.S. PATENT DOCUMENTS

| 4,574,190 A | 3/1986 | Wood et al. |
| 4,902,108 A * | 2/1990 | Byker ..................... B60R 1/088 359/265 |
| 5,321,544 A | 6/1994 | Parkhe et al. |
| (Continued) | | |

FOREIGN PATENT DOCUMENTS

| CN | 103353700 A | 10/2013 |
| JP | S59124367 A | 7/1984 |
| (Continued) | | |

OTHER PUBLICATIONS

International Search Report and Written Opinion for PCT Application No. PCT/US2015/018980, dated Jun. 16, 2015, 15 pages.
(Continued)

*Primary Examiner* — Nicole Blan
(74) *Attorney, Agent, or Firm* — Abel Schillinger, LLP; Robert N Young

(57) ABSTRACT

Several of the films that comprise various energy producing or control devices, for example, electrochromic devices, lithium batteries, and photovoltaic cells, are sensitive to moisture in some way. They may be especially vulnerable to moisture at particular stages during their fabrication. It may also be highly desirable during fabrication to be able to wash particulates from the surface. The particulates may be generated some aspect of the fabrication process, or they may arise from the environment in which the fabrication takes place. This invention shows ways to remove said particles from the surface without incurring the damage associated with typical washing processes, resulting in higher manufacturing yields and better device performance.

16 Claims, 2 Drawing Sheets

(56) References Cited

U.S. PATENT DOCUMENTS

| | | | |
|---|---|---|---|
| 5,456,759 A * | 10/1995 | Stanford, Jr. | B08B 3/12 134/1 |
| 5,889,608 A | 3/1999 | Buffat et al. | |
| 6,856,444 B2 | 2/2005 | Ingalls et al. | |
| 7,133,181 B2 | 11/2006 | Greer | |
| 7,372,610 B2 | 5/2008 | Burdis et al. | |
| 7,593,154 B2 | 9/2009 | Burdis et al. | |
| 8,421,347 B2 | 4/2013 | Yamagishi et al. | |
| 2002/0094944 A1 * | 7/2002 | Flynn | C07C 43/12 510/412 |
| 2003/0227663 A1 | 12/2003 | Agrawal et al. | |
| 2003/0228744 A1 * | 12/2003 | Kohno | H01L 21/02063 438/585 |
| 2005/0029492 A1 * | 2/2005 | Subawalla | C11D 1/72 252/79.4 |
| 2005/0197273 A1 * | 9/2005 | Savu | C11D 1/004 510/412 |
| 2006/0128600 A1 | 6/2006 | Freer et al. | |
| 2007/0178613 A1 * | 8/2007 | Matsumura | H01L 21/02063 438/17 |
| 2008/0142055 A1 * | 6/2008 | Yin | B08B 3/12 134/95.1 |
| 2008/0299487 A1 * | 12/2008 | Chang | G03F 7/2041 430/270.1 |
| 2009/0029274 A1 | 1/2009 | Olson et al. | |
| 2009/0155549 A1 | 6/2009 | Hoshino et al. | |
| 2010/0243427 A1 * | 9/2010 | Kozlowski | C03C 17/3417 204/192.1 |
| 2011/0013254 A1 * | 1/2011 | Widjaja | B60R 1/088 359/273 |
| 2011/0065621 A1 | 3/2011 | Freer et al. | |
| 2012/0045202 A1 | 2/2012 | Jiang et al. | |
| 2012/0145202 A1 | 6/2012 | Freer et al. | |
| 2013/0020113 A1 * | 1/2013 | Corbea | H01B 1/08 174/257 |
| 2014/0022621 A1 | 1/2014 | Kailasam et al. | |

FOREIGN PATENT DOCUMENTS

| | | |
|---|---|---|
| JP | 2000502409 A | 2/2000 |
| JP | 2005026338 A | 1/2005 |
| JP | 2005333015 A | 12/2005 |
| JP | 2007121418 A | 5/2007 |
| JP | 2007184600 A | 7/2007 |
| JP | 2007208246 A | 8/2007 |
| JP | 2009048141 A | 3/2009 |
| JP | 2009522777 A | 6/2009 |
| JP | 2009526099 A | 7/2009 |
| JP | 2011191588 A | 9/2011 |
| JP | 2012532352 A | 12/2012 |
| JP | 2014521128 A | 8/2014 |
| KR | 20090042784 A | 4/2009 |
| KR | 20130010603 A | 1/2013 |
| WO | 2007033008 A2 | 3/2007 |
| WO | 2009025647 A1 | 2/2009 |
| WO | 2009148861 A2 | 12/2009 |
| WO | 2010147105 A1 | 12/2010 |
| WO | 2011024951 A1 | 3/2011 |

OTHER PUBLICATIONS

3M Novec 7000 Product Information, 3M Company, Sep. 9, 2009, pp. 1-6.

3M Novec HFE 7500 Material Safety Data Sheet, 3M Company, Jul. 19, 2002, pp. 1-7.

3M Novec HFE 7300, Guidechem, http://guidechem.com/dictionary/132182-92-4.html, 2010-2017, p. 1.

3M Novec HFE 7200 Material Safety Data Sheet, 3M Company, Oct. 6, 2004, pp. 1-9.

3M Novec HFE 7100 Material Safety Data Sheet, 3M Company, Jun. 6, 2005, pp. 1-8.

Sbar et al., "Electrochromic dymanic windows for office buildings", International Journal of Sustainable Built Environment, 2012 (1), pp. 125-139.

3M Novec 71IPA Engineered Fluid, 3M Company, 2009, pp. 1-4.

Wolf, "Silicon Processing for the VLSI Era", vol. 1: Process Technology, Lattice Press, pp. 225-226 (1986).

* cited by examiner

PARTICLE REMOVAL FROM ELECTROCHROMIC FILMS USING NON-AQUEOUS FLUIDS

BACKGROUND OF THE INVENTION

Large area electronic energy control, display or lighting products that are permanently mounted in structures, such as buildings, ships, aircraft, trains, buses, or cars, may include electronic or electro-optical devices (collectively "electronic energy control devices"), such as electrochromic, OLED, electroluminescent, electro-reflective, LCD, and other monolithic display or lighting devices, in which an electronically and optically active media is contained between closely spaced electrodes. The appearance of the lighting or a display created by such electronic energy control devices may be adversely affected by the presence of defects in the active or inactive media that locally modify the potential between the electrodes.

Electronic energy control devices by also be used to modify light transmission over small areas, for example, displays, illuminators, vision systems, sensors, and similar devices. The undesirable effect of a defect is even greater when the size of the device becomes similar to, or even smaller, that the area affected by the defect.

For example, electrochromic devices include electrochromic materials that are known to change their optical properties, in response to application of an electrical potential, so as to make the device, for example, more or less transparent or reflective, or have a desired coloration.

The manufacture of an electrochromic device typically includes forming an electrochromic (EC) film stack including a plurality of layers of conductive and electrochromic material on a substrate, such as glass. See, for example, U.S. Pat. Nos. 5,321,544, 6,856,444, 7,372,610 and 7,593,154, incorporated by reference herein. During the manufacturing process, defects sometimes may be formed in one or more of the layers of the EC film that can cause the electrochromic device to have a different optical behavior than desired, or lack a desired optical behavior, at or near the location of the defect when the device is operated by applying an electrical potential thereto. The defect may be a short between conductive layers of the EC film stack caused, for example, by foreign contaminants, or a material non-uniformity or scratch in one or more of layers of the EC film stack, that causes the EC device, when operated, to have at the location of the defect optical properties different than those desired and present at locations adjacent to the defect. The defect, hence, may cause the EC device to have an undesirable aesthetic appearance when operated.

Although various techniques are known and may be performed to repair a defect in an electronic energy control device, such as an electrochromic device, during manufacture, some defects still may remain in a final, manufactured electronic energy control device product. For example, an electrochromic device included in a final, manufactured electrochromic device product, such as an insulated glass unit (IGU), may include defects visible only when the electrochromic device transitions between an energized and non-energized state, and defects not visible in visible or near infrared light. Oftentimes, such defects are noticed or appear only after installation of the electrochromic device product, for example, as an exterior window in a high rise building. It is always more desirable to eliminate the cause of a defect than to try to repair a defect after it has occurred.

It is desirable to reduce the total number of defects or, if possible, completely eliminate all visual or non-visual defects. During the manufacturing of an EC device, or related devices, particulate material or other contaminants may be introduced. For example, the vacuum process for the deposition of the film stack in electrochromic devices may be interrupted at some point in between the deposition of the upper and lower electrical conductors for the purpose of patterning the lower conductor into the proper electrical circuit. After patterning the lower conductor (so that the appropriate electrical connections can be made and voltage applied), EC device processing continues by deposition of the remainder of the film stack. Particles may be generated by the removal, patterning, and other steps between the two deposition steps can have visible defects in the completed EC device, including, as noted above, those defects which may become visible to the operator.

Conventional application of water to remove particulate contaminants may, in some instances, leave water spots, stains, or water flow patterns. Depending on the nature of the substrate or surface being exposed to the water treatment or cleaning, the substrate may bleach, discolor, or become less electrically efficient. In a worst case scenario, water could lead to uniformity differences in coloration of EC devices. Such water-induced defects may only appear during dynamic switching of an electrochromic device, making them difficult to detect, yet sill unappealing to users of the device. There remains the need to remove particulate material or other contaminants generated during the manufacturing process without degrading any of the material surfaces or film stacks present in an EC device or other like device (EC device, photochromic device, thermochromic device, liquid crystal display, organic light emitting diode, batteries, or individual thin film materials in other discrete or stand-alone applications).

BRIEF SUMMARY OF THE INVENTION

In one aspect of the present invention is a method of preparing a substrate for the receipt of a film or coating material to be deposited in communication with the substrate.

In another aspect of the present invention is a method of preparing a substrate for the receipt of a film or coating material to be deposited in communication with the substrate, where the substrate is at least partially contaminated with particulate matter.

In another aspect of the present invention is a method of preparing a surface of a substrate comprising either directing a stream of non-aqueous liquid or otherwise exposing the substrate to a non-aqueous liquid, the surface comprising particulate material, and removing at least a portion of the non-aqueous liquid and at least about 80% of the particulate material from the surface. In some embodiments, at least about 90% of the particulate material is removed from the surface.

In another aspect of the present invention is a method of preparing an electrochromic device, comprising: (a) depositing a first conductive layer on a substrate; (b) patterning the first conductive layer; (c) removing particulate material ejected from the pattering from a surface of the first conductive layer, the material removed by directing a stream of non-aqueous fluid towards the surface; (d) depositing one of an electrochromic layer or a counter electrode layer on the first conductive layer, thereby providing a first deposited electrode, (e) depositing an ion-conductor layer on the first deposited electrode, (f) depositing the other of the electrochromic layer or the counter electrode layer on the ion-conductor layer, thereby providing a second deposited electrode, and (g) depositing a second conductive layer on the second deposited electrode.

In some embodiments, the non-aqueous liquid comprises about 10% water. In other embodiments, the non-aqueous liquid comprises about 5% water. In other embodiments, the non-aqueous liquid comprises about 1% water. In other embodiments, the non-aqueous liquid comprises about 0.1% water. In other embodiments, the non-aqueous liquid comprises less than about 0.01% water.

In some embodiments, the non-aqueous liquid is non-polar. In some embodiments, the non-aqueous liquid is polar. In some embodiments, the non-aqueous liquid is characterized by a specified range of values of polar moment. For example, polar solvents may be classified as those having a molecular dipole moment of about 1.4 Debeye to about 5.0 Debeye, with water being about 1.85 Debeye. Non-polar solvents may be classified as having molecular dipole moments from about 0.0 Debeye to about 1.1 Debeye. Very strongly non-polar solvents, such as pentane and hexane, have moments very close to 0.0 Debeye. Semi-polar solvents are found at all values of dipole strength in between these extremes, and specific values may be desirable in certain instances. All liquids will fit somewhere on this gradient. In some embodiments, the non-aqueous liquid comprises a fluorocarbon, hydrofluorocarbon, or surfactant. In some embodiments, the particulate material has a size ranging from between about 1 μm to about 1 mm. In other embodiments, the particulate material has a size ranging from between about 1 μm to about 500 μm. In other embodiments, the particulate material has a size ranging from between about 1 μm to about 250 μm.

In some embodiments, an energy is applied to the non-aqueous liquid to assist in removing the particulate material.

In some embodiments, the electrochromic device has less than about 1 defect per 1 square meter. In some embodiments, the substrate is a laminate. In some embodiments, the electrochromic device is part of an insulated glass unit. In some embodiments, the insulated glass unit further comprises a photovoltaic device. In some embodiments, the electrochromic device is heat treated. In some embodiments, lithium is inserted into at least one of the first or second electrodes or the ion conductor layer.

In another aspect of the present invention is a method of preparing a surface of a substrate comprising directing a stream of non-aqueous liquid or exposing the surface being prepared to a non-aqueous liquid, the surface comprising particulate material having a size between about 1 μm and about 1 mm, and removing at least about 98% of the non-aqueous liquid and at least about 90% of the particular material from the surface.

In some embodiments, the surface is comprised of a silicate glass, a non-silicate glass, a crystal, such as silicon, germanium, sapphire, lithium niobate, alkali earth titanates, a polymer, a copolymer, a liquid crystal polymer, a film of inorganic material, a film of organic material, or a composite of organic material and inorganic material. In some embodiments, the surface is a conductive layer of an electrochromic device, a battery, a photovoltaic device, a thermochromic device, a liquid-crystal display device, an organic light emitting diode device, or a zenithal bistable device. Conductive layers could comprise metals, for example, gold, silver, copper, nickel, or aluminum, transparent conducting oxides, for example, indium tin oxide, aluminum zinc oxide, fluorinated tin oxide, and carbon based materials such as grapheme sheets, fullerene and graphite nanotube coatings. In some embodiments, the surface is a non-conductive layer of an electrochromic device, a battery, a photovoltaic device, a thermochromic device, a liquid crystal display device, an organic light emitting diode device, zenithal bistable device. In some embodiments, the surface is a conductive layer of an electrochromic device. In some embodiments the surface is part of the substrate that also supports the electrochromic or other energy device.

In some embodiments, the conductive surface consists of a metal, for example, gold, silver, copper, aluminum, nickel, titanium, niobium, tin, indium, or a metal alloy, for example brass or stainless steel.

In other embodiments, the conductive surface consists of a non-metallic conductor, for example indium tin oxide, aluminum zinc oxide, fluorine-doped tin oxide, and similar materials.

In yet other embodiments, the conductive surface consists of a form of graphite, such as graphene sheets, nanotubes, fullerene spheres, coated or bonded to a substrate, or forming the substrate itself.

In some embodiments, the non-aqueous liquid comprises less than about 10%. In other embodiments, the non-aqueous liquid comprises about 5% water. In other embodiments, the non-aqueous liquid comprises about 1% water. In other embodiments, the non-aqueous liquid comprises about 0.1% water. In other embodiments, the non-aqueous liquid comprises less than about 0.01% water.

In some embodiments, the non-aqueous liquid is non-polar. In some embodiments, the non-aqueous liquid is polar. In some embodiments, the non-aqueous liquid is characterized by a specified range of values of polar moment. A liquid with a molecular dipole moment greater than about 1.4 Debeye is considered polar, while one with a molecular dipole moment for less than about 1.1 Debeye is considered non-polar. Semi-polar liquids exist with molecular dipole moments between these values. In some embodiments, the non-aqueous liquid comprises a fluorocarbon, hydrofluorocarbon, or a surfactant. In some embodiments, the particulate material has a size ranging from between about 1 μm to about 1 mm. In some embodiments, the energy is applied to the non-aqueous liquid to assist in removing the particulate material.

DETAILED DESCRIPTION

Figure 1:
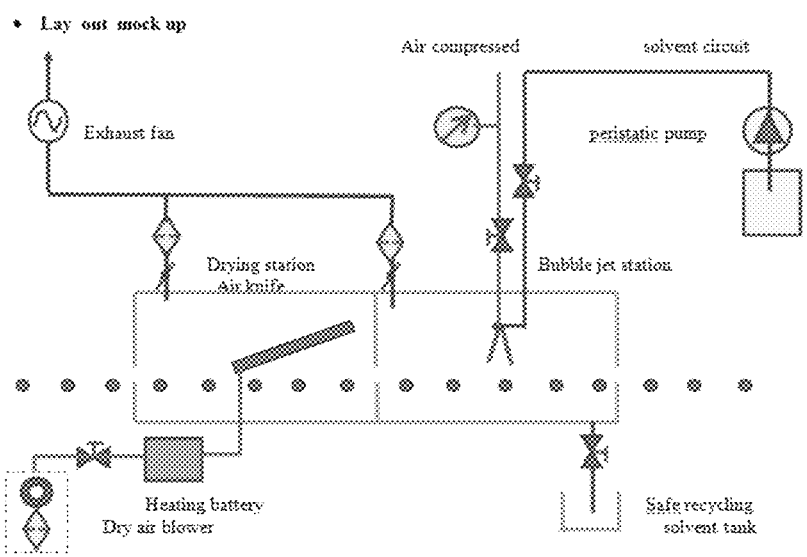
FIG. 1 shows a particular washer concept.
Figure 2:
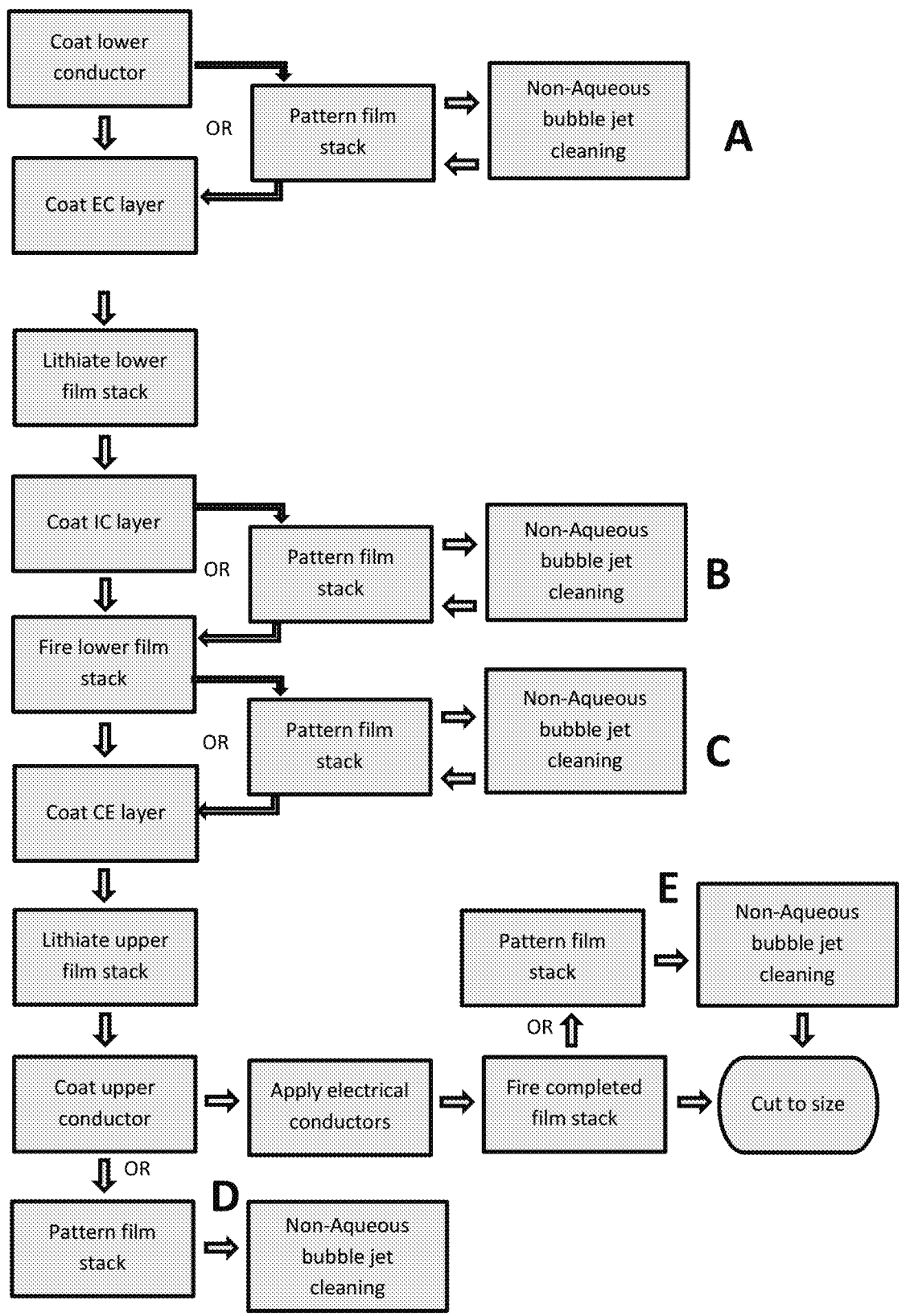
FIG. 2 provides for a process flow chart.

In one embodiment is method of preparing a substrate or the surface of a substrate for the receipt of a film or coating material to be deposited in communication with the substrate. In another embodiment is a method of preparing a substrate for the receipt of a film or coating material to be deposited in communication with the substrate, where the substrate is at least partially contaminated with particulate matter. In some embodiments, the particulate material comprises material removed from the surface of the substrate in a prior process step (e.g. particulate defects). In some embodiments, at least about 90% of a particulate material having a size greater than 2 μm is removed from the surface of the substrate.

In another embodiment is a method of removing particles from a substrate surface, or a surface of a film stack deposited therein, without affecting the appearance of a device comprising the substrate or film stack. In some embodiments, the device is an electrochromic device, an LCD panel, a photovoltaic device, a thermochromic device, a battery, or any other equivalent device that employs at least one thin film in its operation. In some embodiments the method employs removing particulate defects with a non-aqueous solution, provided that the non-aqueous solution used does not substantially interact with the substrate or the films deposited on the substrate.

In general, the method employs exposing the surface to be cleaned to a non-aqueous fluid, particularly with the addition of some source of energy to enable this fluid to dislodge particles from the surface. The surface may include any substrate, including those comprised of glass, polymers, organic or inorganic thin films (including those films that make up the various layers of electrochromic devices, photovoltaic devices, thermochromic devices, LCDs, etc.). A stream of non-aqueous fluid may be directed at a specific angle incident to the surface of the substrate and provided at a specific pressure, force, or energy to best effect removal of particular matter. Any stream angle or pressure, force, or energy may be employed provided it does not cause damage to the surface of the substrate or any underlying layers that are present. Other forms of energy may be introduced into the liquid to dislodge particulates, for example ultrasonic vibration, bubble jet impact, laser-induced thermal shock, vapor condensation, and motion of brushes.

In some embodiments the particular matter is made of a material that is the same as a material of the underlying substrate. Without wishing to be bound by any particular theory, it is believed that any particulate matter left behind could create visible defects in any completed device (e.g. electrochromic device) or could create short circuits in a device (e.g. a battery or smart window).

In some embodiments, the particles to be removed have a size ranging from between about 1 μm to about 1 mm. In other embodiments, the particulate material has a size ranging from between about 1 μm to about 500 μm. In other embodiments, the particulate material has a size ranging from between about 1 μm to about 250 μm. In yet other embodiments, the particles to be removed have a size ranging from between about 2 μm to about 200 μm. In some embodiments, between about 70% and about 95% of particles having a size between about 2 μm and about 200 μm are removed.

By way of example, in some embodiments a conductive layer is deposited on a glass substrate, and material is removed from the conductive layer in a process to pattern a shape into the conductive layer. The material ejected from by patterning process (which is of itself comprised largely of the material constituting the conductive oxide layer itself) could be left behind on the surface of the conductive layer and is desirable to be removed.

In some embodiments, the non-aqueous fluid stream is directed toward the surface to be prepared through a bubble jet. A bubble jet employs a high energy jet of liquid from a special nozzle to force particles away from the surface in such a manner that the particles may be flushed away and removed or collected. The bubble jet does this in a manner that does not damage the surface being prepared or any of the underlying layers or film sticks beneath the surface being prepared.

In other embodiments, the non-aqueous fluid is applied to a surface and then brushes or air streams are used to flush and remove or loosen particulate matter. The non-aqueous fluid may also be applied and energy supplied from ultrasonic transducers to affect mechanical energy transfer to the particulate matter and ultimately flushing or loosening of the material from the substrate or surface to be prepared.

The person of ordinary skill in the art would be able to envision other means through which mechanical energy may be applied, in conjunction with the non-aqueous fluid, to affect a flushing or loosening of particulate matter from the substrate or surface to be prepared by transferring the applied mechanical or kinetic energy to the particulate matter.

Fluids having low surface energies, for example, 3M Novec 7300, are used to advantage because this property assists in keeping particles removed from a surface in suspension. Proper surfactants added to a higher surface energy non-interacting non-aqueous fluid may be used to advantage for the same purpose.

The non-aqueous fluid may be any fluid that does not interact with the substrate or surface being prepared or any layer in communication with the surface being prepared. In some embodiments, the non-aqueous liquid is a non-polar organic liquid. In other embodiments, the non-aqueous liquid is a polar organic liquid. In other embodiments, the non-aqueous liquid is an organic liquid having a polar moment with a specified range. In other embodiments, the non-aqueous liquid is a polar protic solvent. In yet other embodiments, non-aqueous liquid is a polar aprotic solvent.

In some embodiments, the non-aqueous fluid contains a certain percentage of water. For example, the non-aqueous solution may be a mixture of a non-aqueous organic liquid and water, where the solution may contain up to 0.01% water, provide that the non-aqueous organic liquid and water are miscible. If the non-aqueous liquid contains water, the water is preferred to be deionized water or distilled water.

In some embodiments, the non-aqueous liquid is selected from one that is non-flammable. In some embodiments, the non-aqueous liquid is selected from one that is relatively non-toxic. In some embodiments, the non-aqueous liquid is selected from one that is recyclable (e.g. where the particulate matter could be removed from the liquid, and the liquid reused in subsequent processing). In yet other embodiments, the non-aqueous liquid is an oil with a high flash point, such as those commonly used to store lithium.

In some embodiments, the non-aqueous liquid is pentane, hexane, cyclohexane, benzene, toluene, chloroform or diethyl ether, or mixtures thereof. In other embodiments, the non-aqueous liquid is dichlormethane, tetrahydrofuran, or ethyl acetate or mixtures thereof. In yet other embodiments, the non-aqueous liquid is t-butanol, n-propanol, ethanol, methanol, terpineol, acetic acid, or mixtures thereof, with or without the addition of water.

In some embodiments, the non-aqueous liquid is selected based on the material comprising the particulate defect, such that chemical or physical interactions may exist between the particulate matter and the liquid to assist in the removal of the particulate matter from the surface being prepared. For example, van der Waals forces or hydrogen bonds may temporarily exist between the liquid and the particulate matter aiding in the flushing or loosening of the matter from the surface being prepared (and, in some examples, this would allow lowering of the mechanical energy supplied to the surface or liquid stream). One skilled in the art will be able to select an appropriate liquid and mechanical energy supplied to best flush or loosen materials off the substrate or surface and to prevent damage to the surface or layers in communication with the surface.

In some embodiments, the non-aqueous liquid is a halogenated liquid. In some embodiments, the halogen is fluorine. In some embodiments, the non-aqueous liquid is a hydrofluorocarbon liquid. In other embodiments, the non-aqueous liquid comprises a fluorocarbon. In yet other embodiments, the non-aqueous liquid is a polymeric fluorinated solvent. In yet further embodiments, the non-aqueous liquid comprises a surfactant. In yet further embodiments, the non-aqueous liquid is composed of a non-interacting fluid with the addition of a different surfactant.

Preferred non-aqueous liquids will have at least one of the following properties: (1) only minimally interacts with the surface being prepared; (2) leaves minimal stains or deposits; (3) is readily removable; (4) is relatively non-toxic or non-carcinogenic; (5) low interaction with the environments (e.g. ozone depletion; greenhouse effect); (6) non-flammable or of low flammability; (7) relatively non-corrosive; (8) cost effective; and (9) provides little interaction with upstream or downstream processes (e.g. common washer construction materials).

One example of a family of hydrofluorocarbon liquids is available from 3M under the trade name Novec™. Four examples of 3M Novec™ liquids include 7300, 7200, 7100, and 71IPA. Applicants have found that 71IPA was found to increase film marks similar to those marks left behind from water. However, Applicants have observed that no marks were left from the other liquids in this group. In addition, Applicants have found these liquids to have a suitable low toxicity and are non-flammable, or weakly flammable, making integration into the industrial environment safer than many hydrocarbon based liquids. Moreover, Applicants have found that the fluorocarbon based liquids mark less, cause less bleaching to the surface material to which it is applied, or alter the color or optical density of the surface or dynamic switching rate of any film layers in communication thereof.

In other embodiments, the non-aqueous liquid comprises 3M Novec™ 4200, 3M FC-4434, 3M Novec™4300, 3M FC-4432, 3M Novec™ fluid HFE-7000, 3M Novec™ fluid HFE-7100, 3M Novec™ fluid HFE-7200, 3M Novec™ fluid HFE-7500, 3M Novec™ fluid HFE-71IPA, 3M Fluorinert™ FC-72, 3M Fluorinert™ FC-84, 3M Fluorinert™ FC-77, 3M Fluorinert™ FC-3255, 3M Fluorinert™ FC-3283, 3M Fluorinert™ FC-40, 3M Fluorinert™ FC-43, 3M Fluorinert™ FC-70, and/or 3M FC-4430. In an exemplary embodiment, the non-aqueous liquid comprises 3M Novec™ 4200, 3M FC-4434, 3M Novec™ 4300, 3M FC-4432, 3M Novec™ fluid HFE-7000, 3M Novec™ fluid HFE-7100, 3M Novec™ fluid HFE-7200, 3M Novec™ fluid HFE-7500, 3M Fluorinert™ FC-72, 3M Fluorinert™ FC-84, 3M Fluorinert™ FC-77, 3M Fluorinert™ FC-3255, 3M Fluorinert™ FC-3283, 3M Fluorinert™ FC-40, 3M Fluorinert™ FC-43, 3M Fluorinert™ FC-70, and/or 3M FC-4430. In some embodiments, the liquid has a fluoride concentration, by weight, based on active content, ranging between about 1 ppm and about 50,000 ppm. For example, such fluoride concentration may range between about 100 ppm and about 5000 ppm. has a fluoride concentration, by weight, based on active content, ranging between about 1 ppm and about 50,000 ppm. For example, such fluoride concentration may range between about 100 ppm and about 5000 ppm.

Other non-aqueous liquids include a fluoride surfactant that may be or contain a composition according to the formula: Rf—$SO_3^-M^+$, where the Rf is a C1 to C12 perfluoroalkyl group, and $M^+$ is a cation, a $H^+$ atom or an ammonia group. In some embodiments, the fluoride surfactant may be or contain a composition according to the formula: Rf—$SO_2N^-$—$R^1M^+$, where the Rf is a C1 to C12 perfluoroalkyl group; $R^1$ is H, an alkyl group, a hydroxyalkyl group, an alkylamine oxide group, an alkylcarboxylate group or aminoalkyl group; and $M^+$ is a cation, a $H^+$ atom or an ammonia group. The alkyl, hydroxylalkyl, alkylamine oxide, alkylcarboxylate or aminoalkyl groups of R groups may have from 1 to 6 carbon atoms. The hydroxylalkyl group may have the formula —$(CH_2)x$-OH, where x is an integer from 1 to 6.

Other non-aqueous liquids include a fluoride surfactant may be or contain a composition according to the formula: Rf-Q-$R^1SO_3^-M^+$, where the Rf is a C1 to C12 perfluoroalkyl group; $R^1$ is alkylene of the formula —CnH2n(CHOH) oCmH2m-, the n and m are independently 1 to 6 and o is 0 to 1, and is optionally substituted by a catenary oxygen or nitrogen group; $M^+$ is a cation; Q is —O— or —$SO_2NR^2$—; and the $R^2$— is an H—, alkyl, aryl, hydroxyalkyl, aminoalkyl, or sulfonatoalkyl group, optionally containing one or more catenary oxygen or nitrogen heteroatoms. The alkyl, aryl, hydroxyalkyl, aminoalkyl, or sulfonatoalkyl group may have from 1 to 6 carbon atoms. The hydroxyalkyl group may be of the formula —$C_pH_{2p}$—OH, where the p is an integer from 1 to 6. The aminoalkyl group may be of the formula —$C_pH_{2p}$—$NR^3R^4$, where the p is an integer of 1 to 6 and $R^3$ and $R^4$ are independently H or alkyl groups of 1 to 6 carbon atoms. The $R^1$ group is —CnH2nCH(OH)CmH2m-, and the n and m are independently 1 to 6.

In some embodiments, the non-aqueous liquid is recovered or recycled. For example, the solvent may be filtered to remove particles above a certain size by methods such as vacuum or atmospheric distillation, sub-micro filtration, or sorption filtration.

In one test of non-aqueous liquid exposure, a device substrate was paused on a horizontal conveyor after an electrochromic (EC) layer had been deposited. Several non-aqueous liquids were applied to the surface of the EC film, in quantities of approximately 1 $cm^3$, and allowed to pool on the surface for about 10 seconds. These liquids were applied in locations that were carefully measured and recorded, to allow subsequent observation of the exact locations treated. After about 10 seconds of elapsed time, an air jet was used to blow the pool of liquid across the device. At this point, no marks associated with the liquids were visible on the surface. This substrate was then further processed. After processing, this device (an electrochromic device) was colored and bleached according to standard test protocols, and the measured locations at which the test liquids had been applied were carefully monitored.

Five liquids were used in this experiment: deionized water (control); 3M Novec 7300; 3M Novec 7200; 3M Novec 7100; and 3M Novec 71IPA. The presence of water in the test as a control insured that this particular film stack did in fact exhibit its characteristic sensitivity to water, and so assured us that were dealing with a film stack that behaved in the expected manner. The results are shown in the following Table A:

| Liquid: | Test 1 | Test 2 |
| --- | --- | --- |
| DI water | very strongly marked | not used |
| Novec 71IPA | strongly marked | strongly marked |
| Novec 7100 | no visible marks | no visible marks |
| Novec 7200 | no visible marks | no visible marks |
| Novec 7300 | no visible marks | no visible marks |

Test 2: Test 2 was a repeat of Test 1, except that water was not used as the control. The marking of the electrochromic device produced by 3M Novec 71IPA was so similar to that of water that the water was omitted to allow a larger area of the device to be exposed to each of the four 3M Novec non-aqueous solvents. In each case, the non-polar, highly inert, pure Novec fluorinated solvents, left no marks at all visible in the electrochromic device during coloring or bleaching. The water left mottled light areas with dark edges around the original pool location, and dark-edged light streaks in areas over which the liquid had been blown by the applied air jets. These defects showed up at various points in the coloring and bleaching cycles, as well as in the final fully colored state, and were characterized by differences in switching rate, as well as ultimate optical density. Novec 71IPA, which is a combination of Novec 7100 and isopropanol (IPA), showed behavior very similar to that of water, but a little less strongly marked. Novec 7100, along with Novec 7200 and Novec 7300, showed no marking of the electrochromic devices at all, while bleaching, coloring, or in transition. The lack of transitional defects is a critical point, since lowered switching speed is the first indication of an interaction between the cleaning fluid and the electrochromic device.

A flat glass washer using bubble jet energy and 3M Novec 7300 has been designed and constructed to demonstrate the effectiveness of this method of particle removal, without damage the electrochromic films. A drawing of this system is found in FIG. 1.

Process flow diagram showing alternate locations for patterning and non-aqueous cleaning of particulate debris. The cleaning step can be inserted wherever particulate removal helps yield and quality. The process flow using patterning/cleaning step B only is preferred.

The invention claimed is:

1. A method of forming an electrochromic device comprising:
   depositing a first conductive layer over a substrate;
   depositing a first electrode layer over the first conductive layer, wherein the first electrode layer is one of an electrochromic layer or a counter electrode layer;
   depositing an ion conductor layer over the first electrode layer, wherein a film stack includes the first conductive layer, the first electrode layer, and the ion conductor layer;
   exposing the ion conductor layer to a non-aqueous liquid to remove particulate material having a size between about 0.1 µm and about 1000 µm, wherein the non-aqueous liquid is selected from the group consisting of a hydrofluorocarbon, a fluorocarbon, a polymeric fluorinated solvent, and a fluoride surfactant;
   depositing a second electrode layer over the film stack after exposing the ion conductor layer to the non-aqueous liquid, wherein the second electrode layer is the other of the electrochromic layer or the counter electrode layer; and
   depositing a second conductive layer on the second electrode layer, wherein the electrochromic device has a defect density of less than 1 defect/m$^2$, and wherein the electrochromic device is configured for use in a window.

2. The method of claim 1, wherein the non-aqueous liquid is delivered to a surface of the substrate in the form of a stream or jet of sufficient velocity to dislodge at least some of the particulate material from the surface on which it impinges.

3. The method of claim 1, wherein the temperature of the non-aqueous liquid and of a surface of the substrate are independently controlled.

4. The method of claim 1, wherein the non-aqueous liquid comprises less than about 0.1% of water.

5. The method of claim 1, wherein the first electrode layer is the electrochromic layer, and the second electrode layer is the counter electrode layer.

6. The method of claim 1, wherein the non-aqueous liquid is non-polar.

7. The method of claim 1, wherein the non-aqueous liquid is polar.

8. The method of claim 1, wherein the non-aqueous liquid comprises a fluorocarbon, hydrofluorocarbon, or a polymeric fluorinated solvent.

9. The method according to claim 1, wherein an energy is applied, the energy selected from the group consisting of ultrasonic agitation of the liquid, bubble jet agitation, and thermal heating of the liquid.

10. The method of claim 1, further comprising lithiating the electrochromic layer, the ion conductor layer, or the counter electrode layer.

11. The method of claim 1, further comprising patterning the film stack before exposing the film stack to the non-aqueous liquid.

12. The method of claim 1, wherein the defect density is less than 1 short circuit/m$^2$.

13. The method of claim 1, wherein the defect density is less than 1 visible defect/m$^2$.

14. The method of claim 1, wherein the non-aqueous liquid has a fluoride concentration, by weight, based on active content, ranging between about 1 ppm and about 50,000 ppm.

15. The method of claim 1, wherein the fluoride surfactant includes:
   Rf—SO$_3^-$M$^+$, where the Rf is a C1 to C12 perfluoroalkyl group, and M$^+$ is a cation, a H$^{30}$ atom or an ammonia group; or
   Rf—SO$_2$N$^-$—R$^1$M$^+$, where the Rf is a C1 to C12 perfluoroalkyl group; R$^1$ is H, an alkyl group, a hydroxyalkyl group, an alkylamine oxide group, an alkylcarboxylate group or aminoalkyl group; and M$^+$ is a cation, a H$^+$ atom or an ammonia group.

16. A method of forming an electrochromic device comprising:
   depositing a first conductive layer over a substrate;
   depositing a first electrode layer over the first conductive layer, wherein the first electrode layer is one of an electrochromic layer or a counter electrode layer;
   depositing an ion conductor layer over the first electrode layer, wherein a film stack includes the first conductive layer, the first electrode layer, and the ion conductor layer;
   exposing the ion conductor layer to a non-aqueous liquid to remove particulate material having a size between about 0.1 µm and about 1000 µm, wherein the non-aqueous liquid is selected from the group consisting of a hydrofluorocarbon, a fluorocarbon, a polymeric fluorinated solvent, and a fluoride surfactant;
   depositing a second electrode layer over the ion conductor layer after exposing the film stack to the non-aqueous liquid, wherein the second electrode layer is the other of the electrochromic layer or the counter electrode layer; and
   depositing a second conductive layer on the second electrode layer, wherein the electrochromic device has a defect density of less than 1 defect/m$^2$, wherein the electrochromic device is configured to be part of an insulated glass unit, and wherein the electrochromic device is configured for use in a window.

* * * * *

UNITED STATES PATENT AND TRADEMARK OFFICE
CERTIFICATE OF CORRECTION

| | |
|---|---|
| PATENT NO. | : 10,767,143 B2 |
| APPLICATION NO. | : 14/198824 |
| DATED | : September 8, 2020 |
| INVENTOR(S) | : Harvey W. Kalweit, Satya Kumar Ajjarapu and Jean-Christophe Giron |

It is certified that error appears in the above-identified patent and that said Letters Patent is hereby corrected as shown below:

On the Title Page

Item (57), Abstract, Line 7-8, please delete "may be generated some", and insert --may be generated by some--

In the Claims

Column 10, Line 22, please delete "circuit/m$^2$.", and insert --defect/m$^2$.--

Column 10, Line 32, please delete "H$^{30}$ atom", and insert --H$^+$ atom--

Column 10, Line 37, please delete "and M$^+$is", and insert --and M$^+$ is--

Column 10, Line 38, please delete "a H$^+$atom", and insert --a H$^+$ atom--

Signed and Sealed this
Twenty-seventh Day of September, 2022

Katherine Kelly Vidal
*Director of the United States Patent and Trademark Office*